United States Patent
Chen et al.

[11] Patent Number: 5,907,781
[45] Date of Patent: May 25, 1999

[54] PROCESS FOR FABRICATING AN INTEGRATED CIRCUIT WITH A SELF-ALIGNED CONTACT

[75] Inventors: Hung-Sheng Chen, San Jose; Unsoon Kim, San Clara; Yu Sun, Saratoga; Chi Chang, Redwood City; Mark Ramsbey, Sunnyvale; Mark Randolph, San Jose; Tatsuya Kajita, Cupertino; Angela Hui, Fremont; Fei Wang, San Jose; Mark Chang, Los Altos, all of Calif.

[73] Assignees: Advanced Micro Devices, Inc., Sunnyvale, Calif.; Fujitsu Limited, Kanagawa; Fujitsu AMD Semiconductor Limited, Fukushima, both of Japan

[21] Appl. No.: 09/049,517
[22] Filed: Mar. 27, 1998
[51] Int. Cl.⁶ .................................................. H01L 21/335
[52] U.S. Cl. .......................... 438/303; 438/622; 438/629; 438/634; 438/656
[58] Field of Search .................................. 438/229, 230, 438/233, 299, 301, 303, 622, 629, 630, 634, 633, 656; 257/752, 758, 760, 763

[56] References Cited

U.S. PATENT DOCUMENTS

| | | | |
|---|---|---|---|
| 4,977,108 | 12/1990 | Haskell | 438/586 |
| 5,028,555 | 7/1991 | Haskell | 438/217 |
| 5,210,047 | 5/1993 | Woo et al. | 438/257 |
| 5,275,963 | 1/1994 | Cederbaum et al. | 438/624 |
| 5,459,354 | 10/1995 | Hara | 257/754 |
| 5,646,063 | 7/1997 | Mehta et al. | 438/425 |
| 5,792,684 | 8/1998 | Lee et al. | 438/238 |
| 5,807,779 | 9/1998 | Liaw | 438/279 |

OTHER PUBLICATIONS

Ishigaki, Y., et al., Low Parasitic Resistance Technologies with NES–SAC and SWT–CVD Process . . . , 1994 IEEE Symposium on VLSI Technology Digest of Technical Papers, Jun. 7–9, 1994, pp. 99–100.

Kuesters, K., et al., "Self–Aligned Bitline Contact for 4 Mbit DRAM", Proceedings of the 1987 Symposium on ULSI Science and Technology, pp. 640–, 1984.

*Primary Examiner*—T. N. Quach
*Attorney, Agent, or Firm*—Foley & Lardner

[57] ABSTRACT

A method of forming a contact in a flash memory device utilizes a local interconnect process technique. The local interconnect process technique allows the contact to butt against or overlap a stacked gate associated with the memory cell. The contact can include tungsten. The stacked gate is covered by a barrier layer which also covers the insulative spacers.

20 Claims, 4 Drawing Sheets

PROCESS FOR FABRICATING AN INTEGRATED CIRCUIT WITH A SELF-ALIGNED CONTACT

BACKGROUND OF THE INVENTION

The present invention relates generally to the fabrication of integrated circuits. More particularly, the present invention relates to a process for fabricating contacts for integrated circuit devices.

Contacts are required in an integrated circuit device to provide electrical connections between layers or levels of the integrated circuit device. Semiconductor devices typically include a multitude of transistors which are coupled together in particular configurations through the use of contacts.

In a conventional flash memory cell, a memory cell includes a stacked gate, a drain, and a source. A drain contact electrically connects the drain of the memory cell to a conductive layer (a bit line) above the stacked gate. The conductive layer can be a polysilicon layer, first metal layer, or other layer utilized to connect a bit line to a storage node (drain) of the memory cell.

Additionally, the source of the memory cell is often coupled to a source line with a VSS implant (e.g., a VSS connector or a self-aligned source (SAS) module). Sources of neighboring transistors are coupled together at the substrate level (in the active region). The SAS module is typically fabricated according to the following steps: a SAS mask and etch of LOCOS oxide, a VSS connection mask and implant. Module fabrication requires two critical masking steps, one during the SAS mask and etch and another during the VSS connection mask and implant.

The fabrication steps related to the SAS module can be somewhat disadvantageous. Etching steps can cause charge damage in the active region. Also, the SAS module can be disadvantageous due to its sheet resistance and size.

Contacts associated with the flash memory cell must be spaced from the polysilicon associated with the stacked gate. As feature sizes are reduced according to integrated circuit processes, smaller dimensions are required to achieve higher packing densities. Generally, contacts must be spaced apart from the stacked gate so alignment errors do not result in a shorting of the stacked gate with the source contact or the drain contact. The spacing between the contact and gate contributes to the overall size of the flash memory cell.

Thus, there is a need to eliminate the need for a SAS module. Further, there is a need to relax contact to gate spacing requirements. Further still, there is a need for a flash memory with a smaller cell size. Further still, there is a need to reduce VSS source line resistance.

SUMMARY OF THE INVENTION

The present invention relates generally to a method of fabricating a contact for a transistor. The transistor has a stacked gate, a source, and a drain. The method includes depositing an etch stop layer over the stacked gate, the drain, and the source, depositing a first interlevel dielectric layer over the etch stop layer, etching the first interlevel dielectric layer and the etch stop layer from above the source and drain, depositing a first conductive material above the source and the drain, planarizing the first conductive material to a first level approximate a second level of the first interlevel dielectric layer, depositing a second interlevel dielectric layer above the first conductive material, etching the second interlevel dielectric layer to form a contact hole above the drain, and filling the contact hole with a second conductive material to form the contact. The method allows the contact to overlap or butt against the gate.

The present invention further relates to a method of fabricating an integrated circuit on a semiconductor substrate. The semiconductor substrate includes at least one stacked gate disposed between a source and a drain. The stacked gate includes a first barrier layer. The method includes depositing an insulative layer over the stacked gate, etching the insulative layer to leave insulative side wall spacers for the stacked gate, depositing a second barrier layer over the stacked gate, depositing a first interlevel dielectric layer over the second barrier, etching the first interlevel dielectric layer and the second barrier layer in accordance with a self-aligned contact mask, depositing a first conductive material above the source and the drain, depositing a second interlevel dielectric layer above the first conductive material, and forming a contact through the second interlevel dielectric layer. The contact is electrically coupled to the first conductive material.

The present invention even further relates to a method of fabricating an integrated circuit on a semiconductor substrate. The semiconductor substrate includes at least one gate disposed between a source and a drain. The method includes depositing a barrier layer over the gate, the source, and the drain, depositing a first interlevel dielectric layer over the first barrier layer, etching the first interlevel dielectric layer and the first barrier layer in accordance with a self-aligned contact mask, depositing a first conductive material over the source and the drain, depositing a second interlevel dielectric layer above the first conductive material and the first interlevel dielectric layer, and forming a contact through the second dielectric layer. The contact is electrically coupled to the first conductive material. The first interlevel dielectric layer and the barrier layer are removed from above the source and above the drain when the first interlevel dielectric layer is etched.

According to one exemplary aspect of the present invention, a local interconnect and self-aligned contact process replaces a self-aligned source (SAS) etch/implant module process for relaxed lithographic requirements. A single local interconnect mask replaces two critical masks. Generally, the conventional source line associated with flash memory devices can be moved from the active region to the local interconnect level. The process advantageously allows simultaneous formation of the drain contact and the VSS source line with a single local interconnect process.

In accordance with another exemplary embodiment of the present invention, the local interconnect process forms the drain contact and VSS source line via interlayer dielectric deposition/planarization, local interconnect etch, and tungsten (w) plug formation steps. Since the same etch stop layer is utilized for the local interconnect and for the contact etch, relaxed local interconnect and contact size can be maintained while achieving the same cell size. The disadvantages associated with the fabrication of the SAS module are reduced or eliminated.

In accordance with yet another exemplary embodiment of the present invention, spacings between gates and VSS source lines and between gates drain contacts are reduced. The reduced spacings allow larger contact sizes, thereby allowing less stringent lithographic requirements. In one embodiment, the contact can even butt against or overlap the gate.

BRIEF DESCRIPTION OF THE DRAWINGS

The invention will hereinafter be described with reference to the accompanying drawings, wherein like numerals denote like elements, and.

DETAILED DESCRIPTION OF PREFERRED EXEMPLARY EMBODIMENTS

Figure 2:
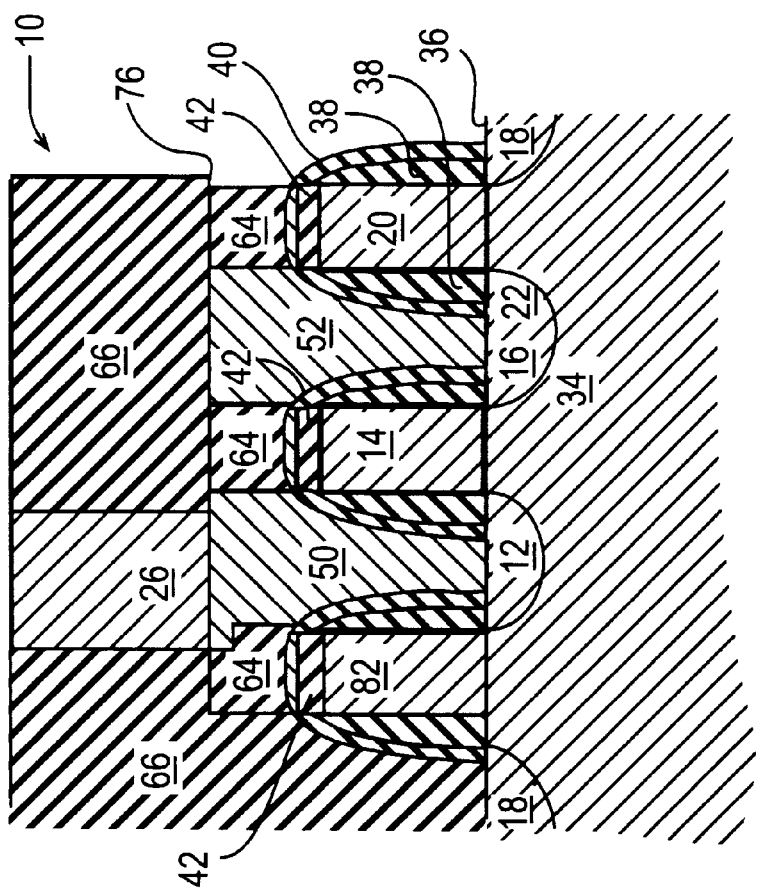
FIG. 2 is a cross-sectional view of the portion of the integrated circuit illustrated in FIG. 1 about line 2—2 in accordance with another exemplary embodiment of the present invention.
Figure 1:
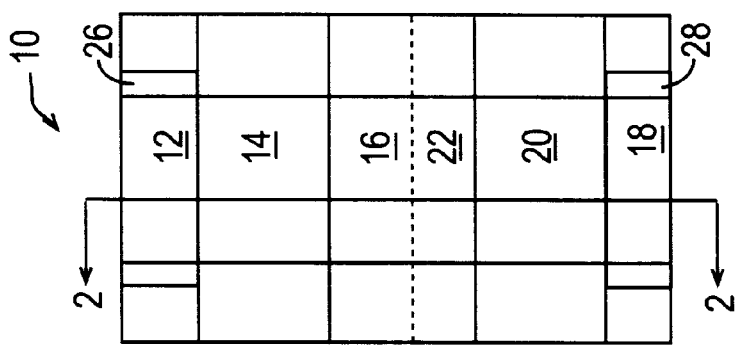
FIG. 1 is a top view of an integrated circuit device including two transistors in accordance with an exemplar embodiment of the present invention.
Figure 4:
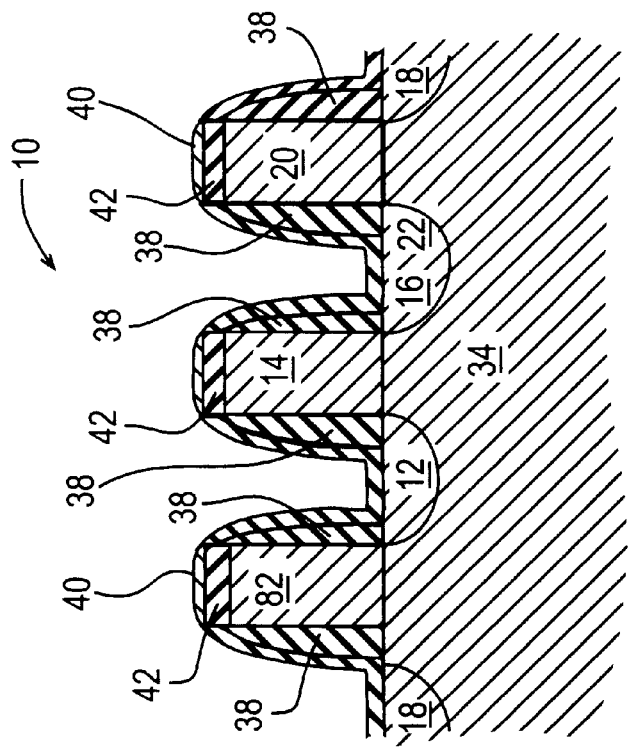
FIG. 4 is a cross-sectional view of the semiconductor substrate illustrated in FIG. 3 showing steps in the process illustrated in FIG. 6.

With reference to FIGS. 1 and 2, a portion 10 of an integrated circuit (IC) or semiconductor device includes two transistors. A first transistor includes a drain 12, a gate 14, and a source 16. Similarly, a second transistor includes a drain 18, a gate 20, and a source 22. Drains 12 and 18 are coupled to contacts 26 and 28, respectively. As shown in FIG. 1, contacts 26 and 28 can extend over all of drain regions 12 and 18, respectively. Thus, contacts 26 and 28 are advantageously the same size or larger than drains 12 and 18 because there is no space requirement between gates 14 and 20 and contacts 26 and 28, respectively.

Portion 10 can include a multitude of diverse electronic components and can be manufactured from various semiconductor processes, such as, complimentary metal oxide semiconductor (CMOS) processes. Portion 10 is provided on a substrate or base 34 (FIG. 2) which is preferably silicon or other semiconductor material. Base 34 can be doped with P-type dopants or N-type dopants. Transistors associated with gates 14 and 20 can be CMOS transistors fabricated in N-type or P-type wells. In FIG. 2, gates 14 and 20 are shown as stacked gates and portion 10 is preferably part of a flash EEPROM.

Base 34 includes drains 12 and 18 and sources 16 and 22. Above a top surface 36 of base 34, gates 14 and 20 are provided.

Gates 14 and 20 are preferably a stacked gate structure for a floating gate transistor. The stacked gate structure can generally include a second polysilicon layer which is provided over a interpoly dielectric layer (i.e., ONO) . The ONO layer is provided over a first polysilicon layer which is provided over a tunnel oxide. The tunnel oxide is provided over surface 36. Additionally, stacked gates 14 and 20 can include a barrier layer 42 and insulative side wall spacers 38.

Drain 12 is coupled to contact 26 through a local interconnect plug 50. Similarly, sources 16 and 22 are coupled to a local interconnect plug 52. A local interconnect plug 51 is coupled to drain 18. Plugs 50, 51 and 52 are formed in a local interconnect process and preferably include tungsten (W). Plug 50 is coupled to contact 26 which is preferably a tungsten (W) plug. Plugs 50 and 52 can advantageously butt up against and overlay gates 14 and 20. Additionally, contact 26 can be misaligned against plugs 50 associated with stack gate 14.

A first interlevel dielectric layer 64 is provided over gates 14 and 20. A second interlevel dielectric layer 66 is provided over plugs 50, 51 and 52 and layer 64. Layers 64 and 66 can be silicon dioxide ($SiO_2$) deposited by a chemical vapor deposition (CVD) process. Layers 64 and 66 can be formed at least partially from tetraethylorthosilicate (TEOS) or tetramethylcyclosilioxane (TMCTS). Alternatively, layers 64 and 66 can be other insulative substances, such as, polymide saline or dichlorosilane and can be deposited by other fabrication techniques.

Figure 3:
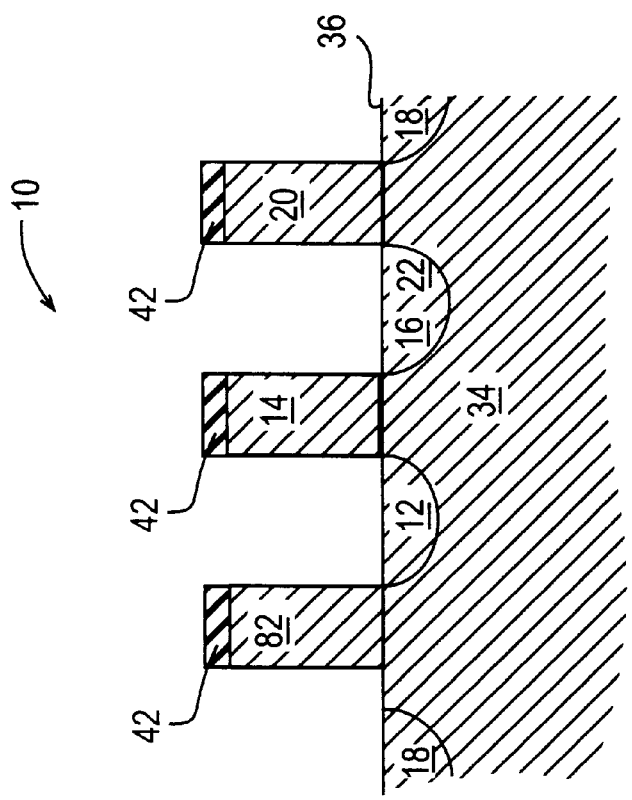
FIG. 3 is a cross-sectional view of the semiconductor substrate illustrated in FIG. 2 showing steps in the process illustrated in FIG. 6.
Figure 5:
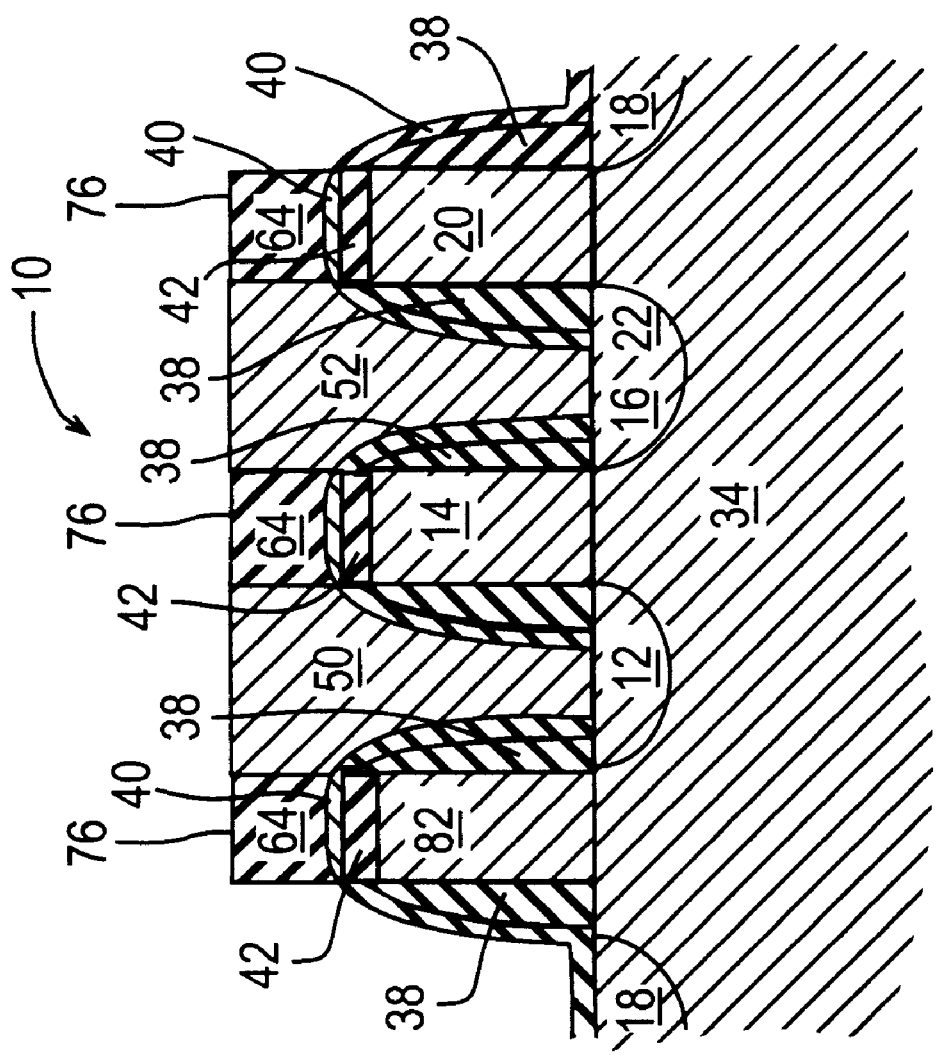
FIG. 5 is a cross-sectional view of the semiconductor substrate illustrated in FIG. 4 showing steps in the process illustrated in FIG. 6.
Figure 6:
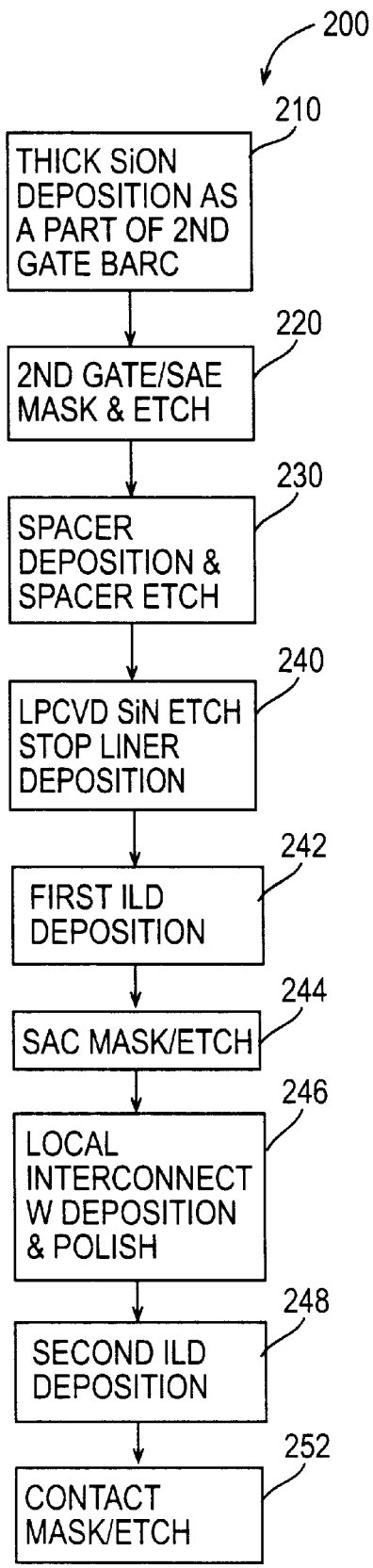
FIG. 6 is a process flow diagram in accordance with yet another exemplary embodiment of the present invention.

With reference to FIGS. 3–6, a process flow 200 for fabricating portion 10 is described as follows: In FIG. 3, base 34 is shown with stacked gates 14 and 20 including barrier layer 42. Barrier layer 42 can be a 1,000 Å layer of silicon oxide nitride (SiON). Layer 42 is provided as a thick barrier layer as a second barrier anti-reflective coating (BARC) over gates 14 and 20 at a step 210 (FIG. 6). Layer 42 is partially etched away in accordance with a self-aligned etch (SAE) mask to leave layer 42 above gates 14 and 20 at a step 220. Layer 42 serves as an etch stop layer during self-aligned contact etching. Layer 42 also serves as an anti-reflective coating.

At a step 230, an insulative material, such as, an oxide material is deposited by chemical vapor deposition (CVD). The insulative material is etched to form spacers 38 (FIG. 4) associated with gates 14 and 20 at step 230. Generally, layer 42 loses approximately 100 Å of material due to the etch associated with spacer 38. At a step 240, a barrier layer 40 including silicon nitride (SiN) is deposited by low pressure chemical vapor deposition (LPCVD) as a liner or etch stop layer 40. Layer 40 is preferably a 1,000 Å thick SiN cap layer or $SiN/SiO_2$ bi-layer which serves as a self-aligned contact (SAC) etch stop layer.

In FIG. 5, a first interlevel dielectric layer 64 is deposited over layer 40 at a step 242 by CVD. Layer 64 is preferably between 1.0 and 1.5 $\mu$m thick and planarized by CMP to a level 76. At a step 244, layer 64 is etched in accordance with a self-aligned contact mask to leave layer 64 above gates 14 and 20. Also, at step 244, layer 40 is etched from above drain 12 and sources 16 and 22 utilizing the self-aligned contact mask. The etching of layers 40 and 64 opens apertures or vias to drain 12 and sources 16 and 22.

With reference to FIG. 5, a local interconnect conductive material is deposited above drain 12 and sources 16 and 22 at a step 246. The local interconnect conductive material is preferably tungsten and is deposited by chemical vapor deposition. Alternatively, other conductive materials such as polysilicon, metal, or other conductive materials can be utilized. After the material is deposited, it is polished by a chemical mechanical polish (CMP) technique to level 76 to form plugs 50 and 52. At a step 248, second interlevel dielectric layer 66 (FIG. 2) is deposited over layer 64, plug 50, and plug 52. Layer 66 is similar to layer 64 and can be deposited by CVD.

After layer 66 is deposited and planarized, layer 66 is etched in accordance with the contact mask at a step 252. A contact 26 comprising tungsten is deposited to make contact with plug 50. Plug 26 can overlap gate 14 or a gate 82. Additionally, plug 50 can butt up against gates 82 and 14. In this way, spacings associated with contact to stack gate are not required for plugs 50 and 52 and contact 26. Thus, the size of portion 10 can be reduced or the lithographic requirements for contact 26 and plugs 50 and 52 can be reduced.

Process 200 advantageously simultaneously forms plugs 50, 51 and 52 during a single local interconnect process. The interconnect process includes steps 242, 244, and 246. By utilizing layer 40 for the self-aligned contact mask and etch at step 244, relaxed local interconnect and contact size can be achieved while maintaining the same cell size. Preferably, plugs 50 and 52 have a size of 0.34×0.34 microns and have a VSS spacing of 0.34 microns. The width of gates 14 and 20 is preferably 0.3 microns and the spacing between gates 14 and plug 50 is eliminated.

It is understood that, while the detailed drawings and specific examples given describe preferred exemplary embodiments of the present invention, they are for the purpose of illustration only. The present invention is not limited to the precise details, methods, materials, and conditions disclosed. For example, although tungsten is suggested, contacts and local interconnects may use other conductive materials. Further, although dry etching is suggested, material may be removed in other processes. Further still, although TEOS is used to provide insulation, other insulative materials are interchangeable. The dimensions, sizes, thicknesses, and shapes shown in the drawings are shown only in an exemplary fashion. The various layers, contacts, cells, and transistors may have different geometries depending upon integrated circuit designs and process technologies.

What is claimed is:

1. A method of fabricating a contact for a transistor, the transistor having a stacked gate, a source, and a drain, the method comprising:

depositing an etch stop layer over the stacked gate, the drain, and the source;

depositing a first interlevel dielectric layer over the etch stop layer;

etching the first interlevel dielectric layer and the etch stop layer from above the source and the drain;

depositing a first conductive material above the source and the drain;

planarizing the first conductive material to a first level approximate a second level of the first interlevel dielectric layer;

depositing a second interlevel dielectric layer above the first conductive material;

etching the second interlevel dielectric layer to form a contact hole above the drain; and filling the contact hole with a second conductive material to form the contact, whereby the method allows the contact to overlap or butt against the stacked gate.

2. The method of claim 1, wherein the first conductive material is deposited in a local interconnect process.

3. The method of claim 2, wherein the first conductive material includes tungsten.

4. The method of claim 1, wherein the transistor is a portion of a flash memory cell.

5. The method of claim 1, wherein the etch stop layer is a 1000 Angstrom thick $SiN_4/SiO_2$ bi-layer.

6. The method of claim 1, wherein the etching the first interlevel dielectric layer step is a self-aligned etch step.

7. A method of fabricating an integrated circuit on a semiconductor substrate, the semiconductor substrate including at least one stacked gate disposed between a source and a drain, the stacked gate including a first barrier layer, the method comprising:

depositing an insulative layer over the stacked gate;

etching the insulative layer to leave insulative side wall spacers for the stacked gate;

depositing a second barrier layer over the stacked gate;

depositing a first interlevel dielectric layer over the second barrier layer;

etching the first interlevel dielectric layer and the second barrier layer in accordance with a self-aligned contact mask;

depositing a first conductive material above the source and the drain;

depositing a second interlevel dielectric layer above the first conductive material; and forming a contact through the second interlevel dielectric layer, the contact being electrically coupled to the first conductive material.

8. The method of claim 7, wherein the forming step further includes:

etching the second interlevel dielectric layer to form a contact hole above the drain; and filling the contact hole with a second conductive material to form the contact, whereby the method allows the contact to overlap or butt against the stacked gate.

9. The method of claim 8, wherein the first conductive material and the second conductive material are deposited in a local interconnect process.

10. The method of claim 9, wherein the first conductive material and the second conductive material include tungsten.

11. The method of claim 10, wherein the integrated circuit is a flash memory cell.

12. The method of claim 11, wherein the second barrier layer is a 1000 Angstrom thick nitride layer.

13. The method of claim 12, wherein the first barrier layer is SiON.

14. A method of fabricating an integrated circuit on a semiconductor substrate, the semiconductor substrate including at least one gate disposed between a source and a drain, the method comprising:

depositing a barrier layer over the gate, the source, and the drain;

depositing a first interlevel dielectric layer over the first barrier layer;

etching the first interlevel dielectric layer and the first barrier layer in accordance with a self-aligned contact mask, the first interlevel dielectric layer and the barrier layer being removed from above the source and above the drain;

depositing a first conductive material above the source and the drain;

depositing a second interlevel dielectric layer above the first conductive material and the first interlevel dielectric layer; and forming a contact through the second interlevel dielectric layer, the contact being electrically coupled to the first conductive material.

15. The method of claim 14, wherein the first interlevel dielectric layer and the second interlevel dielectric layer are deposited by low pressure chemical vapor deposition.

16. The method of claim 14, wherein the contact is formed by etching the second dielectric layer and depositing tungsten.

17. The method of claim 14, wherein the first conductive material is deposited in a local interconnect process.

18. The method of claim 14, wherein the contact is a drain contact for a flash memory cell.

19. The method of claim 14, wherein the barrier layer is a nitride layer.

20. The method of claim 14, further comprising:

planarizing the first conductive material to a level of the first interlevel dielectric layer.

* * * * *